(12) United States Patent
Mahler et al.

(10) Patent No.: US 8,947,886 B2
(45) Date of Patent: Feb. 3, 2015

(54) ELECTRONIC COMPONENT

(75) Inventors: Joachim Mahler, Regensburg (DE); Manfred Mengel, Bad Abbach (DE); Khalil Hosseini, Weihmichl (DE); Klaus Schmidt, Nittendorf (DE); Franz-Peter Kalz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 232 days.

(21) Appl. No.: 13/186,112

(22) Filed: Jul. 19, 2011

(65) Prior Publication Data

US 2013/0021766 A1 Jan. 24, 2013

(51) Int. Cl.
*H05K 7/00* (2006.01)
*H05K 1/16* (2006.01)
*H01L 23/00* (2006.01)

(52) U.S. Cl.
CPC ....... *H01L 24/00* (2013.01); *H01L 2924/01327* (2013.01); *H01L 2924/13055* (2013.01); *H01L 2924/10253* (2013.01); *H01L 2224/056* (2013.01); *H01L 2224/05624* (2013.01); *H01L 2224/05644* (2013.01); *H01L 2224/05647* (2013.01); *H01L 2224/06181* (2013.01)
USPC ........... 361/760; 361/765; 361/772; 361/807; 174/260

(58) Field of Classification Search
USPC ................ 361/772, 760, 765, 767, 774, 777, 361/807–810; 174/260; 257/669, 679, 708, 257/739
See application file for complete search history.

(56) References Cited

U.S. PATENT DOCUMENTS

| | | | | |
|---|---|---|---|---|
| 6,670,222 | B1 * | 12/2003 | Brodsky | 438/118 |
| 6,822,875 | B2 * | 11/2004 | Chan et al. | 361/760 |
| 7,626,262 | B2 | 12/2009 | Otremba et al. | |
| 2008/0067630 | A1 * | 3/2008 | Hellmund et al. | 257/565 |
| 2010/0052149 | A1 | 3/2010 | Nose et al. | |
| 2012/0074568 | A1 * | 3/2012 | Eichinger et al. | 257/741 |

* cited by examiner

*Primary Examiner* — Dion R Ferguson
(74) *Attorney, Agent, or Firm* — Slater & Matsil, L.L.P.

(57) ABSTRACT

An electronic component includes an electrically conductive carrier. The electrically conductive carrier includes a carrier surface and a semiconductor chip includes a chip surface. One or both of the carrier surface and the chip surface include a non-planar structure. The chip is attached to the carrier with the chip surface facing towards the carrier surface so that a gap is provided between the chip surface and the carrier surface due to the non-planar structure of one or both of the carrier surface and the first chip surface. The electronic component further includes a first galvanically deposited metallic layer situated in the gap.

26 Claims, 5 Drawing Sheets

FIG 1
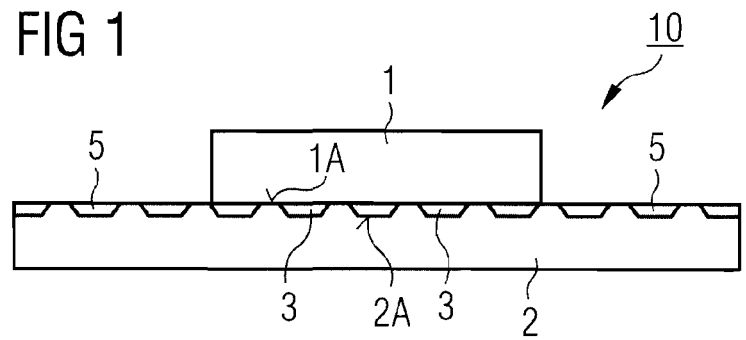
FIG 2A
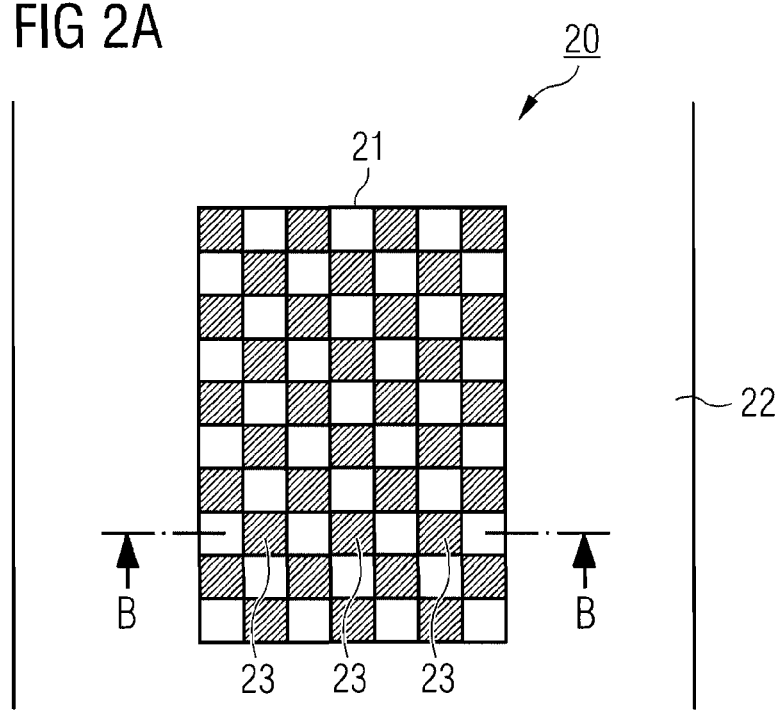
FIG 2B

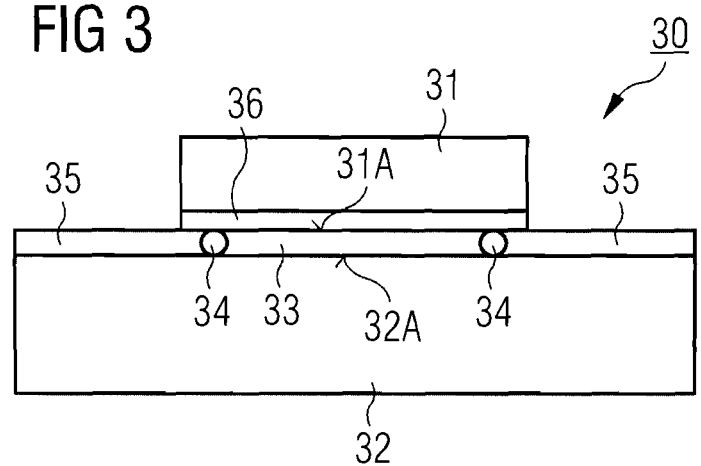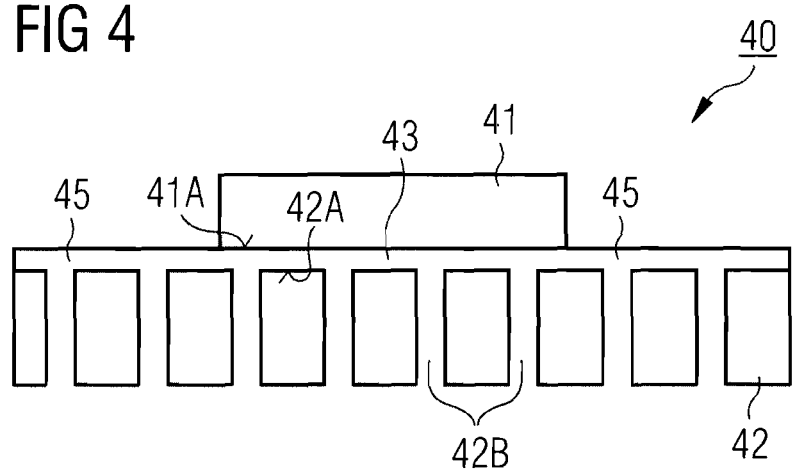

ELECTRONIC COMPONENT

TECHNICAL FIELD

The present invention relates to an electronic component and a method for fabricating an electronic component.

BACKGROUND

When semiconductor chips are mounted onto electrically conductive carriers like, for example, leadframes problems may occur due to the different thermal expansion coefficients of the semiconductor material and the carrier material. In particular, if during the mounting process of the semiconductor chip onto the carrier a certain elevated temperature is applied to the assembly like, for example, in a solder process (T=380° C.) or in an adhering process (T=200° C.) very high thermal mechanical stress may occur due to the different thermal expansion coefficients. In case of thinned semiconductor chips these stress reactions may even lead to macroscopic damage of the semiconductor chip as the formation of tears and cracks. In other cases the stress may lead to a strong deformation of the semiconductor substrate so that the following process steps are no longer possible like, for example, laser thrilling, lamination, wire bonding, etc. In general, the stress generated in the semiconductor chip severely affects the reliability of the following process steps.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a schematic cross-sectional side view representation of an electronic component according to an embodiment;

FIGS. 2A, 2B show a schematic top view representation (FIG. 2A) and a schematic cross-sectional side view representation along a line B-B (FIG. 2B) of an electronic component according to an embodiment;

FIG. 3 shows a schematic cross-sectional side view representation of an electronic component according to an embodiment;

FIG. 4 shows a schematic cross-sectional side view representation of an electronic component according to an embodiment;

DETAILED DESCRIPTION OF ILLUSTRATIVE EMBODIMENTS

Figure 5:
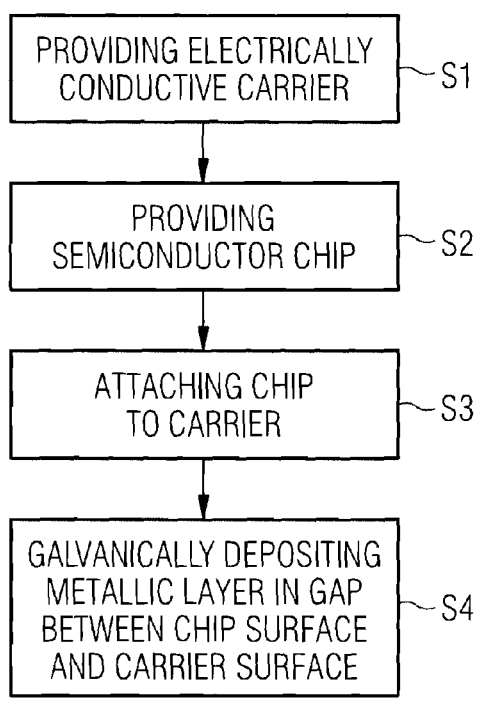
FIG. 5 shows a flow diagram of a method for fabricating an electronic component according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic component and a method for fabricating an electronic component may use various types of semiconductor chips or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal such as aluminum, gold, or copper, for example, or a metal alloy, or an electrically conducting organic material, or an electrically conducting semiconductor material.

In the claims and in the following description different embodiments of a method for fabricating an electronic component are described as a particular sequence of processes or measures, in particular in the flow diagrams. It is to be noted that the embodiments should not be limited to the particular sequence described. Particular ones or all of the different processes or measures can also be conducted simultaneously or in any other useful and appropriate sequence.

The various embodiments shown and described in the following are characterized by the following principle advantages:

- minimal die attach layer thickness of "0" which means that no adhesive layer has to be used so that a die attach layer thickness is virtually zero;
- minimal thermo-mechanical stress between chip and leadframe or carrier;
- minimal bending of the carrier or leadframe after die attach;
- avoiding of any additional die attach process by adhering or soldering;
- parallel chip attach and fabrication of layer on the surface of the carrier or leadframe; and
- improved thermal and electrical connection between chip and carrier.

Referring to FIG. 1, there is shown a schematic cross-sectional side view representation of an electronic component according to an embodiment. The electronic component 10 of FIG. 1 comprises an electrically conductive carrier 2 comprising a carrier surface 2A and a semiconductor chip 1 comprising a chip surface 1A. The semiconductor chip 1 is attached to the electrically conductive carrier 2 with the chip surface 1A facing towards the carrier surface 2A so that a gap is provided between the chip surface 1A and the carrier surface 2A due to the non-planar structure of one or both of the carrier surface 2A and the chip surface 1A. The electronic component 10 further comprises a first galvanically deposited metallic layer 3 situated in the gap.

The first galvanically deposited metallic layer 3 extends directly between the chip surface 1A and the carrier surface 2A and is electrically conductive. Further-on, the first galvanically deposited metallic layer 3 can be structurally identified by a characteristic micro-structure, from which the growth mechanism and direction may be identified, as well as by its texture and crystallographic perfection. The first galvanically deposited metallic layer 3 can therefore be distinguished from a metallic layer formed by other deposition techniques such as sputtering or thermal evaporation or chemical vapor deposition and from metallic layers provided by a metallic sheet which is typically formed by rolling. The first galvanically deposited layer 3 can also be distinguished structurally from a metallic layer formed from a soft solder or diffusion solder. The galvanically deposited metallic layer 3 may be tin-free and free from soft solder and diffusion solder. The connection structure of the galvanically deposited metallic layer may also be tin-free and free from soft solder and diffusion solder.

The first galvanically deposited metallic layer 3 is positioned in the gap between the chip surface 1A and the carrier surface 2A and extends directly from the chip surface 1A to the carrier surface 2A. The interface between the first galvanically deposited metallic layer 3 and each of the chip surface 1A and the carrier surface 2A is free of further adhesives, solder-based materials including soft solder as well as the inter-metallic phases formed during a diffusion solder process. The structure of this interface also enables the first galvanically deposited metallic layer 3 to be distinguished from other electrically conductive connection structures, such as, for example, a diffusion solder bond, which may also be deposited by galvanic deposition but which is afterwards subject to a further heat treatment to create the bond. The interfaces between the first galvanically deposited metallic layer 3 and the chip surface 1A and the carrier surface 2A of the electronic component 10 are free from inter-metallic phases caused by a reaction between the first galvanically deposited metallic layer 3 and the material of the adjoining surfaces.

According to an embodiment of the electronic component 10 of FIG. 1, the first galvanically deposited metallic layer 3 may comprise a metal or an alloy and may consist essentially of silver, copper, nickel, a silver-based alloy, a copper-based alloy, and a nickel-based alloy like, for example, a silver-nickel-based alloy.

According to an embodiment of the electronic component 10 of FIG. 1, the non-planar structure is due to a surface roughness of one or more of the chip surface 1A or the carrier surface 2A. As illustrated in FIG. 1, the surface roughness can be a natural surface roughness of, for example, the carrier surface 2A, of the electrically conductive carrier 2 as obtained after fabrication of the electrically conductive carrier 2. According to an embodiment thereof, the non-planar structure is due to a surface roughness of the carrier surface 2A, wherein the surface roughness is characterized by an average depth of depressions greater than 3 μm.

According to an embodiment of the electronic component 10 of FIG. 1, the non-planar structure is due to an artificial surface treatment of one or more of the chip surface 1A and the carrier surface 2A. According to an embodiment thereof, the artificial surface treatment is such that an average depth of artificially generated depressions is in a range from 1 μm-100 μm. The artificial surface treatment may, for example, comprise an artificial surface roughening like, for example, scratching of the carrier surface 2A. Such sort of artificial roughening may be carried out in a way so that a plurality of regularly spaced or irregularly spaced grooves is generated in the carrier surface 2A. The artificial roughening can also be carried out such that a regular or irregular surface structure with equally or differently spaced depressions of arbitrary form and shape is generated. The artificial surface treatment can, for example, be carried out by etching regularly and equally spaced depressions into one or more of the chip surface 1A and the carrier surface 2A. In particular, a pre-determined pattern like, for example, a checkered pattern of depressions and elevations can be formed into the chip surface 1A. Another possibility for an artificial surface treatment is to deposit a regular or irregular arrangement of elevations like, for example, cubes, spheres or pyramids, onto the carrier surface 2A. Such elevations can have an average diameter in a range from 1 μm-100 μm.

According to an embodiment of the electronic component 10 of FIG. 1, the electrically conductive carrier 2 comprises a or consists of a leadframe.

According to an embodiment of the electronic component 10 of FIG. 1, the semiconductor chip 1 comprises a metallization layer (not shown) facing towards the conductive carrier 2. The metallization layer will be shown in one of the further embodiments. According to an embodiment thereof, the chip surface 1A of the semiconductor chip 1 can be treated artificially so as to obtain a non-planar structure therein, as was described before, and afterwards the metallization layer is applied to the structured chip surface 1A. The metallization layer, for example, can be or can be connected with one of the electrodes of a device incorporated with the semiconductor chip 1 and one or more further electrodes can be arranged on another main surface of the semiconductor chip 1 opposite to the chip surface 1A.

According to an embodiment of the electronic component 10 of FIG. 1, a second galvanically deposited metallic layer 5 is situated on the carrier surface 2A laterally besides the semiconductor chip 1, in particular on all sides of the semiconductor chip 1. According to an embodiment thereof, the chip surface 1A is coplanar with the surface of the second galvanically deposited metallic layer 5. According to a further embodiment thereof, the first and second galvanically deposited metallic layers 3 and 5 are made of one and the same metallic material. In particular, the first and second galvanically deposited metallic layers 3 and 5 are fabricated during one and the same fabrication step.

According to an embodiment of the electronic component 10 of FIG. 1, the electrically conductive carrier 2 comprises one or more through-holes (not shown) extending from the carrier surface 2A to another carrier surface. In particular, the through-holes extend from the carrier surface 2A to a carrier surface opposed to the carrier surface 2A.

Referring to FIGS. 2A, 2B there is shown a schematic top view representation (FIG. 2A) and a schematic cross-sectional side view representation along a line B-B (FIG. 2B) of an electronic component according to an embodiment. The electronic component 20 of FIGS. 2A, 2B comprises an electrically conductive carrier 22 comprising a carrier surface 22A and a semiconductor chip 21 comprising a chip surface 21A. The semiconductor chip 21 is attached to the carrier 22 with the chip surface 21A facing towards the carrier surface 22A so that a gap is provided between the chip surface 21A and the carrier surface 22A. According to the embodiment of FIGS. 2A, 2B, the gap is due to a non-planar structure of the chip surface 21A. The electronic component 20 further comprises a first galvanically deposited metallic layer 23 situated in the gap.

According to the embodiment of the electronic component 20 of FIGS. 2A, 2B, the non-planar structure of the chip surface 21A is comprised of a regular checkered pattern as can at best be seen in FIG. 2A. The checkered pattern comprises white areas and hatched areas wherein in the hatched areas depressions are etched into the chip surface 21A, e.g., a silicon surface, wherein in the white areas the chip surface 21A is left as it is. The white and hatched areas can have equal size, i.e. side edges of equal length. However, it is also possible to fabricate the white and hatched areas of different areas and sizes. The depressions as formed in the hatched areas can also be seen in the cross-section of FIG. 2B and can have a depth in the range from 1 μm-100 μm, in particular in a range from 5 μm-50 μm. The depressions can be formed by an isotropic etching into the semiconductor surface. The carrier surface 22A is shown to be virtually flat in the cross-sectional view of FIG. 2B, i.e., having no significant surface structure. However, in reality there will also be some roughness on a microscopic scale so that during the step of galvanic deposition the first metallic layer will also be deposited into depressions located around the center of the semiconductor chip 21. It is to be noted that, in particular, the depressions are not necessarily shown to scale with respect to their lateral dimensions related to their vertical dimensions. The lateral dimensions of the depressions can be in a range from 100 μm-2 mm and the distances between the depressions can be in the same range.

Referring to FIG. 3, there is shown a schematic cross-sectional side view representation of an electronic component according to an embodiment. The electronic component 30 of FIG. 3 comprises an electrically conductive carrier 32 comprising a carrier surface 32A and a semiconductor chip 31 comprising a chip surface 31A wherein the semiconductor chip 31 is attached to the carrier 32 so that the chip surface 31A faces towards the carrier surface 32A. The electronic component 30 further comprises at least two spacers 34 positioned between the chip surface 31A and the carrier surface 32A, thereby providing a gap between the chip surface 31A and the carrier surface 32A. The electronic component 30 further comprises a first galvanically deposited metallic layer 33 provided in the gap.

According to an embodiment of the electronic component 30 of FIG. 3, the spacers 34 are positioned near the corners of the semiconductor chip 31. In particular, according to an embodiment thereof, the electronic component 30 comprises four spacers positioned near the four corners of the semiconductor chip 31.

According to an embodiment of the electronic component 30 of FIG. 3, the spacers 34 are fabricated of one or more of a solder material, an adhesive material and a dielectric material.

According to an embodiment of the electronic component 30 of FIG. 3, the semiconductor chip 31 comprises a metallization layer 36 facing towards the carrier 32. The metallization layer 36 is applied to an outside of the semiconductor chip 31 and directly contacts the first galvanically deposited metallic layer 33.

According to an embodiment of the electronic component 30 of FIG. 3, a second galvanically deposited metallic layer 35 is situated on the carrier surface 32A laterally besides the semiconductor chip 31. In particular, the second galvanically deposited metallic layer 35 is situated on the carrier surface 32A laterally on all sides of the semiconductor chip 31. According to an embodiment thereof, the chip surface 31A is coplanar with the surface of the second galvanically deposited metallic layer 35.

According to an embodiment of the electronic component 30 of FIG. 3, the diameter of the spacers 34 is in a range from 0.5 μm-50 μm, more particularly from 2 μm-20 μm. The spacers 34 can have the form of balls or spheres. Alternatively, the spacers 34 can also have the form of strip-like elongated elevations extending, for example, near opposing side edges of the chip surface 31A of the semiconductor chip 31 or near all side edges of the chip surface 31A of the semiconductor chip 31.

According to an embodiment of the electronic component 30 of FIG. 3, the carrier 32 comprises one or more through-holes (not shown) extending from the carrier surface 32A to another carrier surface, in particular to a surface opposing the carrier surface 32A.

Referring to FIG. 4, there is shown a schematic cross-sectional side of an electronic component according to an embodiment. The electronic component 40 comprises an electrically conductive carrier 42 comprising a carrier surface 42A and a semiconductor chip 41 comprising a chip surface 41A wherein the chip 41 is attached to the carrier 42 so that the chip surface 41A faces towards the carrier surface 42A. A gap is provided between the chip surface 41A and the carrier surface 42A wherein the gap can be caused by anyone of the mechanisms as described in the previous embodiments. The carrier 42 comprises a plurality of through-holes 42B extending from the carrier surface 42A down to the surface opposing the carrier surface 42A. The electronic component 40 further comprises a first galvanically deposited metallic layer 43 provided in the gap. The electronic component 40 further comprises a second galvanically deposited metallic layer 45 situated on the carrier surface 42A laterally besides the chip 41. The through-holes 42B serve to assist the process of galvanically depositing the first metallic layer 43 in the gap and the second galvanically deposited metallic layer 45. The through-holes 42B can be in the form of elongated slots or, alternatively, holes with essentially circular cross-sections. The through-holes 42B can also be filled with metallic material deposited during the galvanic deposition step.

Different embodiments have been shown and described so far all of which show a special way of attaching a semiconductor chip to an electrically conductive carrier. These embodiments are characterized by the following advantages. No adhesive layer has to be used so that a die attach layer thickness is virtually zero. Furthermore, there is minimal thermal mechanical stress between the semiconductor chip and the carrier. There is also minimal bending of the leadframe after the semiconductor chip has been attached to it. There is no die attach process like soldering or adhering which may lead to difficulties as they were described in the opening portion of this application. Furthermore, the first metallic layer can be galvanically deposited in parallel with a second metallic layer which is deposited everywhere else on the electrically conductive carrier, for example, the leadframe. It is to be noted in this respect that such a metallic layer is usually applied onto a leadframe in order to enhance its electrical properties and other properties regarding the connection with wire bonds and so on. Furthermore, the above-described embodiments allow an improved thermal and electrical connection between the semiconductor chip and the carrier.

Referring to FIG. 5, a flow-diagram of a method is shown for fabricating an electronic component according to an embodiment. An electrically conductive carrier comprising a carrier surface is provided (s1). A semiconductor chip is provided comprising a chip surface (s2), wherein one or both of the carrier surface and the chip surface comprise a non-planar structure. The chip is attached to the carrier with the chip surface facing towards the carrier surface so that a gap is provided between the chip surface and the carrier surface due to the non-planar structure of one or both of the carrier surface and the chip surface (s3). A first metallic layer is galvanically deposited in the gap (s4).

According to an embodiment of the method of FIG. 5, one or more of the carrier surface and the chip surface are treated to obtain the non-planar structure. According to a further embodiment thereof, the treating may comprise an artificial roughening of one or more of the two surfaces which may result in a regular surface structure or an irregular surface structure depending on the way of treating. According to another embodiment the treating comprises forming a regular pattern, in particular a checkered pattern, of depressions and elevations into one or more of the carrier surface and the first chip surface. In particular, the semiconductor chip is comprised of a silicon chip and a checkered pattern of depressions is etched into the first silicon chip surface. The checkered pattern can be such as described previously in connection with the embodiment as shown in FIG. 4.

According to an embodiment of the method of FIG. 5, the method further comprises galvanically depositing a second metallic layer on the carrier surface laterally besides the chip at the same time as depositing the first metallic layer. In particular, the second metallic layer is galvanically deposited laterally on all sides besides the chip on the first carrier surface. The second metallic layer can be of the same metallic material as the first metallic layer and it can be formed contiguous with the first metallic layer.

According to an embodiment of the method of FIG. 5, attaching the chip to the carrier can be carried out by applying an adhesive tape on the chip surface and pressing the chip to the carrier so that the chip surface adheres to the first carrier surface. The adhesive tape can be in the form of a thin strip attached either onto the chip surface or on the carrier surface in a position near one side edge of the chip or two opposing side edges of the chip or even all four side edges of the chip. Thereafter the step of galvanically depositing the first metallic layer is carried out while the chip is adhered to the carrier by means of the adhesive tape. The adhesive tape can thereafter be left between the chip and the carrier or it can also be removed by adequate means.

According to an embodiment of the method of FIG. 5, attaching the chip to the carrier is carried out by applying a special clamping mechanism for clamping the chip to the carrier wherein the clamping mechanism is removed after galvanically depositing the first metallic layer in the gap.

Figure 6:
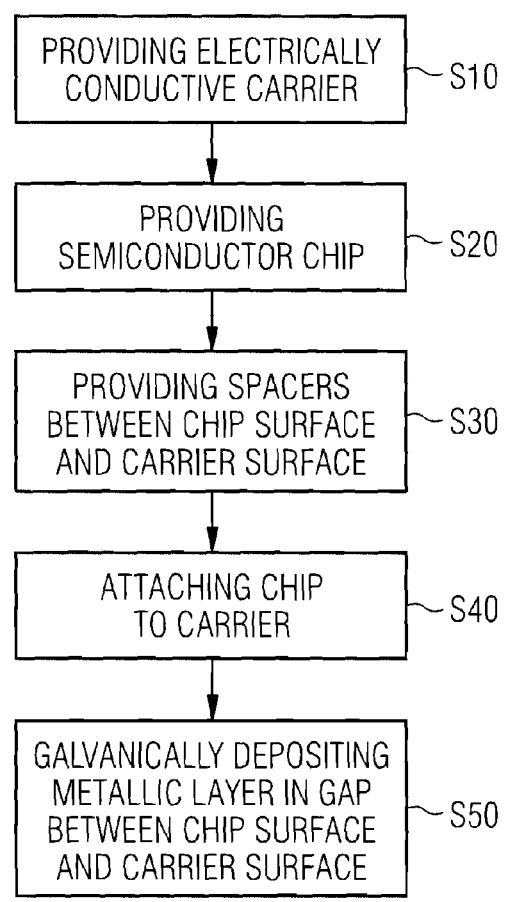
FIG. 6 shows a flow diagram of a method for fabricating an electronic component according to an embodiment.

FIG. 6 shows a flow-diagram of a method for fabricating an electronic component according to an embodiment. In this embodiment, an electrically conductive carrier comprising a carrier surface (s10) and a semiconductor chip comprising a chip surface (s20) are provided. At least two spacers are provided between the chip surface and the carrier surface (s30). The chip is attached to the carrier so that the chip surface faces towards the first carrier surface, thereby providing a gap between the chip surface and the carrier surface (s40). A first metallic layer is galvanically deposited a first metallic layer in the gap (s50).

According to an embodiment of the method of FIG. 6, the method further comprises forming the at least two spacers by applying a spacer layer onto the chip surface and selectively removing the spacer layer so that the at least two spacers are left behind.

According to an embodiment of the method of FIG. 6, at least two spacers are provided in the form of balls, spheres, cubes, or pyramids. According to another embodiment, the spacers are provided in the form elongated strips having a cross-section with the shape of a rectangle, a half-sphere, a cube, or a pyramid.

According to an embodiment of the method of FIG. 6, at least two spacers are made of a solder material, an adhesive material, or a dielectric material.

According to an embodiment of the method of FIG. 6, the method further comprises forming at least two spacers on a wafer level, i.e., at a time when the semiconductor chip is still part of and contiguous with a semiconductor wafer comprising a plurality of semiconductor chips. According to a further embodiment thereof, a spacer layer is applied onto the semiconductor wafer and, thereafter, the spacer layer is selectively removed so that on each semiconductor chip contained within the semiconductor wafer at least two spacers are left behind or, more specifically, four spacers near the four corners of each semiconductor chip are left behind. Before forming the spacers it is possible to apply a metallization layer onto the surface of the semiconductor wafer, i.e., on the respective first surfaces of the semiconductor chips. After forming of the spacers, the semiconductor wafer can be singulated into a plurality of semiconductor chips.

Referring to FIGS. 7A-7F, there are shown schematic representations of intermediate products to illustrate a method for fabricating an electronic component according to an embodiment. The embodiment comprises a wafer level fabrication of a plurality of electronic components as previously described according to the embodiment of FIG. 3.

Figure 7A:
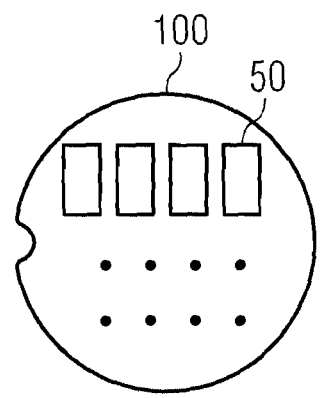
FIGS. 7A-7F show schematic top view representations of intermediate products to illustrate a method for fabricating an electronic component according to an embodiment.

Referring to FIG. 7A, there is shown a processed semiconductor wafer 100 comprising a plurality of processed semiconductor dies 50. The semiconductor wafer 100 and the semiconductor dies 50 are shown in a schematic top view representation so that the upper, active surfaces of the semiconductor dies 50 are shown in FIG. 7A.

Figure 7B:
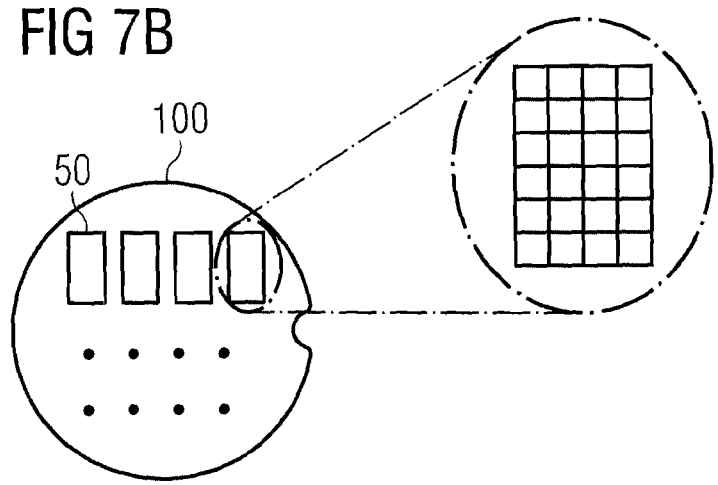

Referring to FIG. 7B, the semiconductor wafer 100 is shown in an upside-down position so that the backside surfaces of the semiconductor dies 50 are shown which are to be mounted each one onto an electrically conductive carrier in a later step. Furthermore, FIG. 7B shows the semiconductor wafer 100 after carrying out a further process step in which the backside surface of each one of the semiconductor dies 50 is subjected to a structuring process. The enlarged circle shows the result of the structuring of the backside of one semiconductor die 50 in somewhat more detail. The pattern, which has been formed into the backside surface of the semiconductor die 50, has already been described in connection with FIG. 2A. It is essentially comprised of a checkered pattern containing equally spaced depressions of square-shaped cross-section, respectively. As long as the semiconductor dies 50 are part of one semiconductor wafer 100, the structuring can be carried out on the wafer level in a very efficient manner by, for example, mask lithography and isotropic etching of the surface of the semiconductor wafer 100.

Figure 7C:
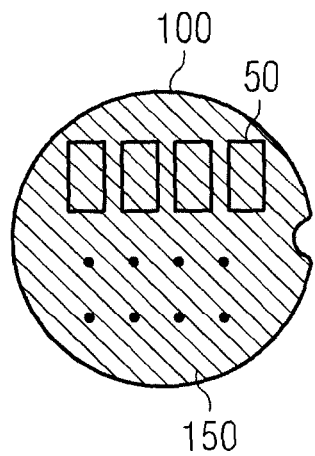

Referring to FIG. 7C, the semiconductor wafer 100 is shown after deposition of a metallization layer 150 onto the back surface of the semiconductor wafer 100. The thickness of the metallization layer 150 can be in a range from 100 nm-5 µm, for example.

Figure 7D:
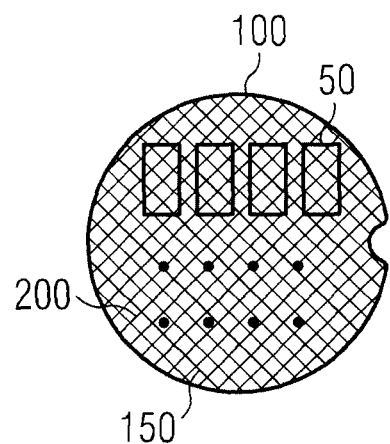

Referring to FIG. 7D, there is shown a further intermediate product comprised of the semiconductor wafer 100 after deposition of an adhesive layer 200 onto the metallization layer 150. The adhesive layer is deposited onto the back surface of the semiconductor wafer 100 with the aim to produce spacers as described in the embodiment of FIGS. 2A, 2B.

Figure 7E:
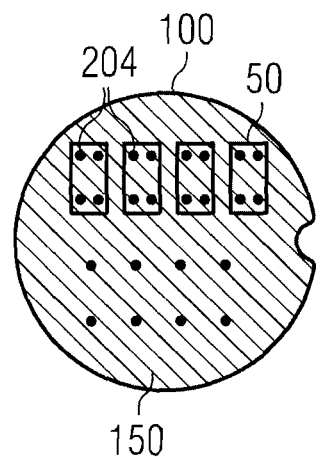

Referring to FIG. 7E, there is shown a further intermediate product of the semiconductor wafer 100 in a situation after structuring of the adhesive layer. The result of the structuring of the adhesive layer is that each one of the semiconductor dies 50 now comprises four spacers 204 situated in the four corners of the semiconductor die 50, respectively.

Figure 7F:
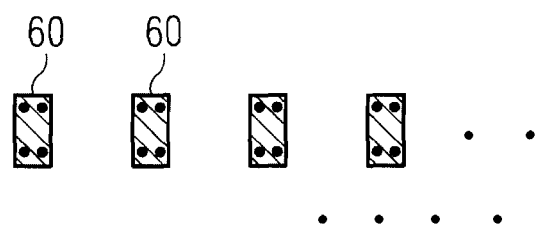

Referring to FIG. 7F, there is shown a plurality of semiconductor chips 60 obtained after singulating the semiconductor wafer 100 and separating the semiconductor dies 50 from each other. The semiconductor chips 60 can now be mounted each one onto an electrically conductive carrier like, for example, a leadframe as explained previously in connection with the embodiment of FIG. 3.

What is claimed is:

1. An electronic component, comprising:
   an electrically conductive carrier comprising a first carrier surface;
   a semiconductor chip comprising a first chip surface having a non-planar structure, wherein the first chip surface of the semiconductor chip is directly disposed on the first carrier surface of the carrier;
   a gap located between the first chip surface and the first carrier surface due to the non-planar structure of the first chip surface; and
   a first galvanically deposited metallic layer located in the gap.

2. The electronic component according to claim 1, wherein the non-planar structure is due to a surface roughness.

3. The electronic component according to claim 2, wherein the surface roughness comprises an average depth of depressions greater than 3 µm.

4. The electronic component according to claim 1, wherein the non-planar structure is due to an artificial surface treatment.

5. The electronic component according to claim 1, wherein the first surface of the semiconductor chip comprises a metallization layer facing towards the carrier.

6. The electronic component according to claim 1, further comprising:
   a second galvanically deposited metallic layer located on the first carrier surface laterally besides the semiconductor chip.

7. The electronic component according to claim 6, wherein the first chip surface is coplanar with a surface of the second galvanically deposited metallic layer.

8. The electronic component according to claim 1, wherein the carrier comprises one or more through-holes extending from the first carrier surface to another carrier surface.

9. An electronic component, comprising:
   an electrically conductive carrier comprising a first carrier surface;
   a semiconductor chip comprising a first chip surface, wherein the first chip surface comprises an electrode, wherein one or both of the first carrier surface and the first chip surface comprise a non-planar structure, and wherein the first chip surface of the semiconductor chip is directly disposed on the first carrier surface of the carrier;
   a gap located between the first chip surface and the first carrier surface due to the non-planar structure of one or both of the first carrier surface and the first chip surface; and
   a galvanically deposited metallic layer located in the gap such that the gap is filled only with the galvanically deposited metallic layer, wherein the galvanically deposited metallic layer electrically connects the electrode to the electrically conductive carrier.

10. The electronic component according to claim 9, wherein the non-planar structure is due to a surface roughness.

11. The electronic component according to claim 10, wherein the surface roughness comprises an average depth of depressions greater than 3 µm.

12. An electronic component, comprising:
   an electrically conductive carrier comprising a first carrier surface, wherein the first carrier surface comprises non-planar structure including depressions of arbitrary form and shape;
   a semiconductor chip comprising a first chip surface, wherein the first chip surface of the semiconductor chip comprises an electrode and is directly disposed on the first carrier surface of the carrier;
   a gap located between the first chip surface and the first carrier surface due to the non-planar structure of the first carrier surface; and
   a first galvanically deposited metallic layer located in the gap, wherein the galvanically deposited metallic layer electrically connects the electrode to the electrically conductive carrier.

13. The electronic component according to claim 12, wherein the non-planar structure comprises a surface roughness, and wherein the surface roughness comprises an average depth of depressions greater than 3 µm.

14. The electronic component according to claim 12, wherein the first galvanically deposited metallic layer comprises silver, copper, nickel, a silver based alloy, a copper based alloy or a nickel based alloy.

15. The electronic component according to claim 12, wherein the first galvanically deposited metallic layer consists essentially of silver, copper, nickel, a silver based alloy, a copper based alloy or a nickel based alloy.

16. The electronic component according to claim 12, wherein the first galvanically deposited metallic layer is solder free.

17. The electronic component according to claim 12, wherein the first galvanically deposited metallic layer is tin-free and free of intermetallic phases.

18. The electronic component according to claim 12, wherein the first galvanically deposited metallic layer is tin-free, soft solder free and diffusion solder free.

19. The electronic component according to claim 12, wherein the first surface of the semiconductor chip comprises a metallization layer.

20. The electronic component according to claim 12, further comprising:
a second galvanically deposited metallic layer situated on the first carrier surface laterally besides the semiconductor chip.

21. The electronic component according to claim 12, wherein the first chip surface is coplanar with a surface of a second galvanically deposited metallic layer.

22. The electronic component according to claim 12, wherein the carrier comprises one or more through-holes extending from the first carrier surface to a second carrier surface.

23. An electronic component, comprising:
an electrically conductive carrier comprising a first carrier surface;
a solder free and an intermetallic phase free metal layer directly disposed on the first carrier surface; and
a semiconductor chip comprising a first chip surface, the first chip surface of the semiconductor chip comprising an electrode and being directly disposed on the solder free and the intermetallic phase free metal layer, wherein the solder free and the intermetallic phase free metal layer electrically connects the electrode to the electrically conductive carrier, wherein the electrically conductive carrier comprises one or more through-holes vertically beneath the first chip surface extending from the first carrier surface to another carrier surface, and wherein the solder free and intermetallic phase free metal layer extends into the one or more through-holes.

24. The electronic component according to claim 23, wherein the solder free and the intermetallic phase free metal layer is disposed in gaps between the first chip surface and the first carrier surface due to a non-planar structure of one or both of the first carrier surface and the first chip surface.

25. The electronic component according to claim 23, wherein the solder free and the intermetallic phase free metal layer consists essentially of silver, copper, nickel, a silver based alloy, a copper based alloy or a nickel based alloy.

26. The electronic component according to claim 23, wherein the first surface of the semiconductor chip comprises a metallization layer.

* * * * *